(12) United States Patent
Haematsu

(10) Patent No.: US 6,664,624 B2
(45) Date of Patent: Dec. 16, 2003

(54) SEMICONDUCTOR DEVICE AND MANUFACTURING METHOD THEREOF

(75) Inventor: Hitoshi Haematsu, Yamanashi (JP)

(73) Assignee: Fujitsu-Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/156,955

(22) Filed: May 30, 2002

(65) Prior Publication Data

US 2002/0180005 A1 Dec. 5, 2002

(30) Foreign Application Priority Data

May 31, 2001 (JP) ........................................ 2001-165701

(51) Int. Cl.[7] ........................ H01L 23/053; H01L 23/12
(52) U.S. Cl. ........................ 257/700; 257/678; 257/687; 257/704; 257/706; 257/707; 257/708; 257/709; 257/711; 257/710; 257/790; 257/787; 257/796; 257/728; 257/664; 257/660; 257/684; 257/659; 174/52.2; 174/52.4; 174/52.5; 174/261; 174/35; 333/12; 333/246; 333/247; 29/613
(58) Field of Search ................. 257/678, 687, 257/700, 704, 706–711, 790, 787, 796, 728, 664, 684, 659, 660; 174/52.2, 52.4, 52.5, 261; 333/12, 246, 247; 29/613; 438/613

(56) References Cited

U.S. PATENT DOCUMENTS

| | | | | |
|---|---|---|---|---|
| 4,016,643 A | * | 4/1977 | Pucel et al. ................. | 438/571 |
| 4,633,573 A | * | 1/1987 | Scherer ....................... | 29/841 |
| 5,189,405 A | * | 2/1993 | Yamashita et al. .......... | 313/512 |
| 5,276,414 A | * | 1/1994 | Fujimoto et al. ........... | 333/246 |
| 5,694,300 A | * | 12/1997 | Mattei et al. ................ | 361/818 |
| 5,731,661 A | * | 3/1998 | So et al. ...................... | 313/504 |
| 5,757,126 A | * | 5/1998 | Harvey et al. .............. | 313/506 |
| 5,771,562 A | * | 6/1998 | Harvey et al. .............. | 29/592.1 |
| 6,140,150 A | * | 10/2000 | Efland et al. ................ | 438/106 |
| 6,548,912 B1 | * | 4/2003 | Graff et al. .................. | 257/787 |
| 6,566,596 B1 | * | 5/2003 | Askew et al. ................. | 174/35 |

FOREIGN PATENT DOCUMENTS

JP     361102757 A  *  5/1986  ................. 257/684

* cited by examiner

Primary Examiner—David A. Zarneke
(74) Attorney, Agent, or Firm—Armstrong, Westerman & Hattori, LLP

(57) ABSTRACT

A source electrode, a gate electrode, and a drain electrode formed on a front face active region of a semiconductor substrate in a shape of teeth of a comb are covered with an insulating film such as polyimede etc., as well as all of the upper surface and the side surfaces of the insulating film are covered with a metal protective film. Via hole receiving pads connected to the source electrode, the gate electrode, and the drain electrode are respectively connected to bonding pads on a reveres face of the semiconductor substrate through via holes.

14 Claims, 6 Drawing Sheets

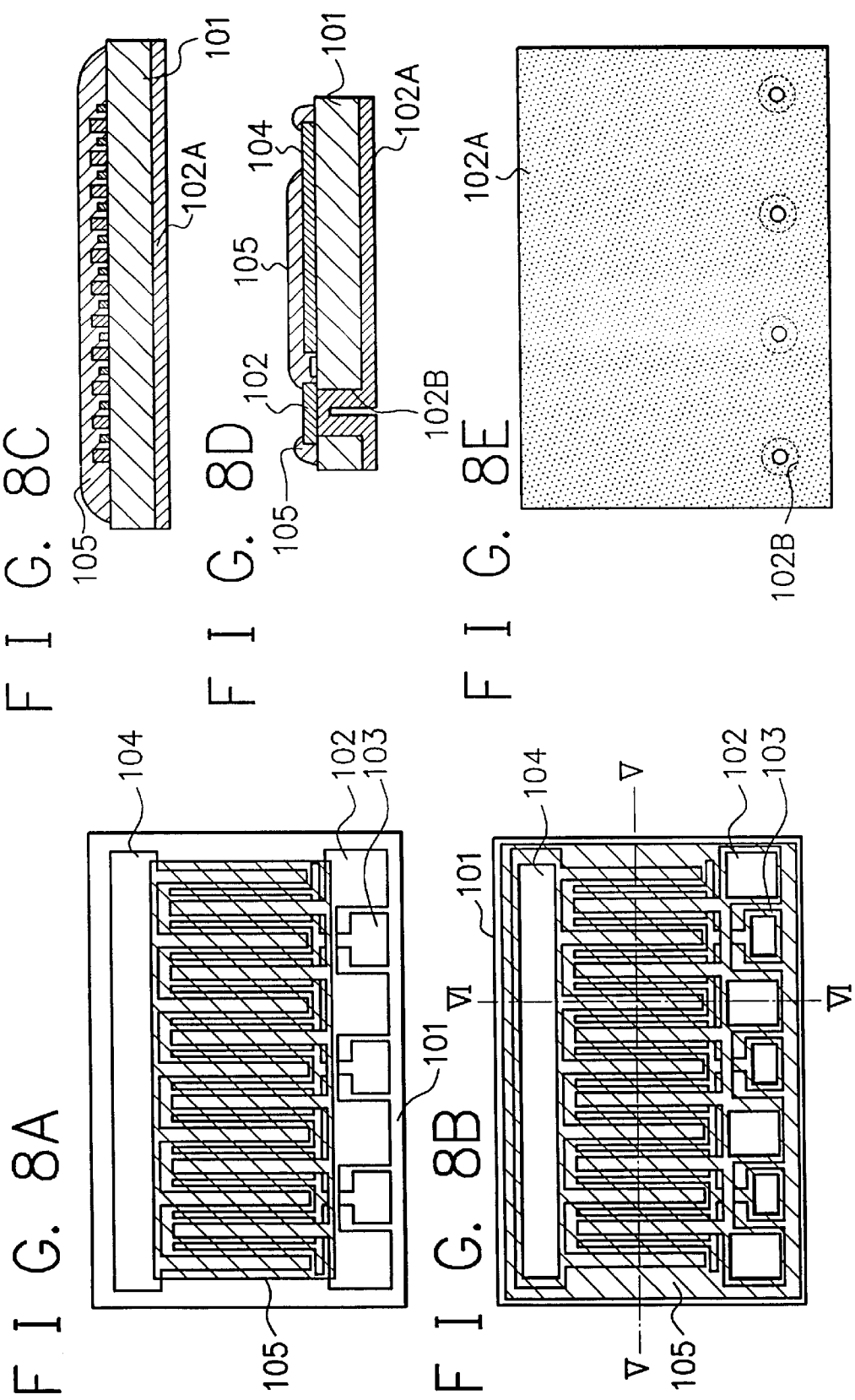

SEMICONDUCTOR DEVICE AND MANUFACTURING METHOD THEREOF

CROSS REFERENCE TO RELATED APPLICATIONS

This application is based upon and claims priority of Japanese Patent Application No. 2001-165701, filed on May 31, 2001, the contents being incorporated herein by reference.

BACKGROUND OF THE INVENTION

1. Field of the Invention

The present invention relates to a semiconductor device and a manufacturing method thereof, and more particularly, the present invention is best suited when applied to a semiconductor device using a resin insulating film such as polyimide, BCB, or the like.

2. Description of the Related Art

Conventionally, a resin insulating film such as polyimide, BCB, or the like is generally used as a front face protective film for a chip mounted by mold etc.

An example of a chip using an insulating film such as polyimide, BCB, or the like as a front face protective film is shown in FIG. 8A to FIG. 8E. FIG. 8A and FIG. 8B are plane views showing a front face of the chip. FIG. 8C is a sectional view taken along the V—V line in FIG. 8B. FIG. 8D is a sectional view taken along the VI—VI line in FIG. 8B. FIG. 8E is a bottom view showing a reverse face of the chip.

On an operating layer of a semiconductor substrate 101, a source electrode, a gate electrode and a drain electrode are formed in a shape of teeth of a comb. A source pad 102, a gate pad 103 and a drain pad 104 are respectively led out from the respective electrodes on the front face of the semiconductor substrate 101.

The upper side of the operating layer of the semiconductor is covered with a surface protective insulating film 105 such as polyimide etc. A view in FIG. 8A shows a specification in which only the upper side of the operating layer is covered with the surface protective insulating film 105. A view in FIG. 8B shows a specification in which all the regions except the respective pad areas 102 to 104 are covered with the surface protective insulating film 105. Thus, exposure of the electrodes and the semiconductor area on the front face of the chip is reduced so as to take a structure aiming for improvement of reliability.

Generally on the chip as structured above, the source pad 102 is connected to a pad 102A on the reverse face of the chip through a via hole 102B, and the pad 102A on the reverse face is mounted as ground of the source.

As described above, an insulating film such as polyimide, BCB, or the like is often used as a front face protective film of a conventional chip. However, a device using polyimide or BCB cannot be utilized for application which requires a high reliability. For example, polyimide has a high water absorbing property and would be saturated with absorbed water in the long term. Then, the water would be soaked out up to fingers such as the gate, the source, and the like to induce corrosion, ion migration, and so on. Therefore, there could be a risk of causing a device trouble. On the other hand, BCB is said to have an extremely small water absorbing property. However, interface between metal and BCB, and BCB itself would be permeated with water. Therefore, there could be a risk of causing the aforementioned trouble.

Due to the above-described problems related to moisture resistance, a highly airtight hermetic seal package is used for a device which requires higher reliability. However, a hermetic seal package is extremely expensive and in some cases it costs several times as much as a chip. Therefore, it will be a big barrier when trying to reduce costs of the product.

SUMMARY OF THE INVENTION

The present invention is made in view of the aforementioned problems. Therefore, it is an object of the invention to obtain a highly reliable semiconductor device having a significantly improved moisture resistance while using an insulating film such as polyimide, BCB, or the like.

The present invention is made in view of the aforementioned problems. Here, metal is focused on because it is easily available, is easily subjected to microfabrication, is a general material used in semiconductor manufacturing, and has a high moisture resistance. Therefore, metal is used to cover all of an upper surface and side surfaces of polyimide, BCB, or the like which is applied as an insulating film above the front face of the semiconductor substrate. That is, in the semiconductor device according to the invention, the front face of a semiconductor chip is covered protectively with the insulating film as well as the whole surfaces of the aforementioned insulating film is covered with a metal protective film having moisture resistance.

A problem when covering the insulating film with metal is that metal is conductive. It is needless to say that the chip cannot work when formed by a usual electrode forming method because all exposed electrodes and pads etc. will be short-circuit. Consequently, in this invention a structure is adopted so that all the necessary electrodes are led out from the front face to the reverse face. In other words, the semiconductor device according to this invention includes a plurality of electrodes connected to an active region on the front face of the semiconductor chip, a resin insulating film provided on the aforementioned active region, a metal protective film covering all of the upper surface and the side surfaces of the aforementioned resin insulating film, and one or a plurality of electrical connecting portions of the reverse face provided at the reverse side of the aforementioned semiconductor chip, leading out at least one electric potential of the aforementioned plurality of electrodes to the reverse face.

Additionally, a manufacturing method of a semiconductor device according to this invention includes a step of forming a plurality of electrodes on a front face of a semiconductor chip, a step of covering the front face of the aforementioned semiconductor chip with a resin insulating film, a step of covering all of the upper surface and the side surfaces of the aforementioned resin insulating film with a metal protective film, and a step of providing an electrical connecting portion of at least any of the aforementioned plurality of electrodes at the reverse face of the aforementioned semiconductor chip.

BRIEF DESCRIPTION OF THE DRAWINGS

FIG. 8A to FIG. 8E are schematic views showing a chip of a conventional example.

DETAILED DESCRIPTION OF THE PREFERRED EMBODIMENTS

Embodiments of a semiconductor device and a manufacturing method thereof according to the present invention will be described hereinafter with reference to the drawings.

First Embodiment

Figure 1A:
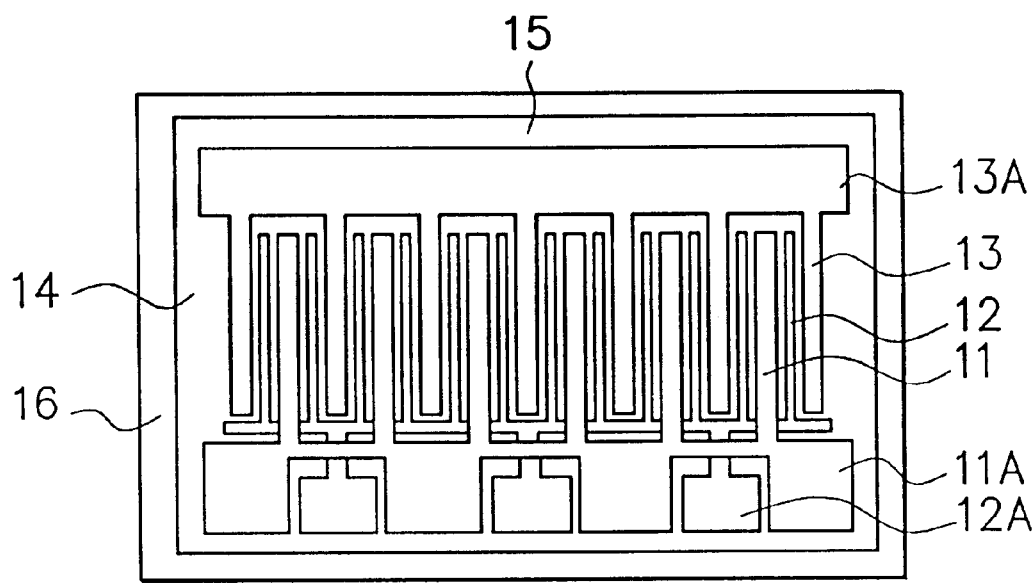
FIG. 1A and FIG. 1B are schematic views showing a chip of a first embodiment.
Figure 1B:
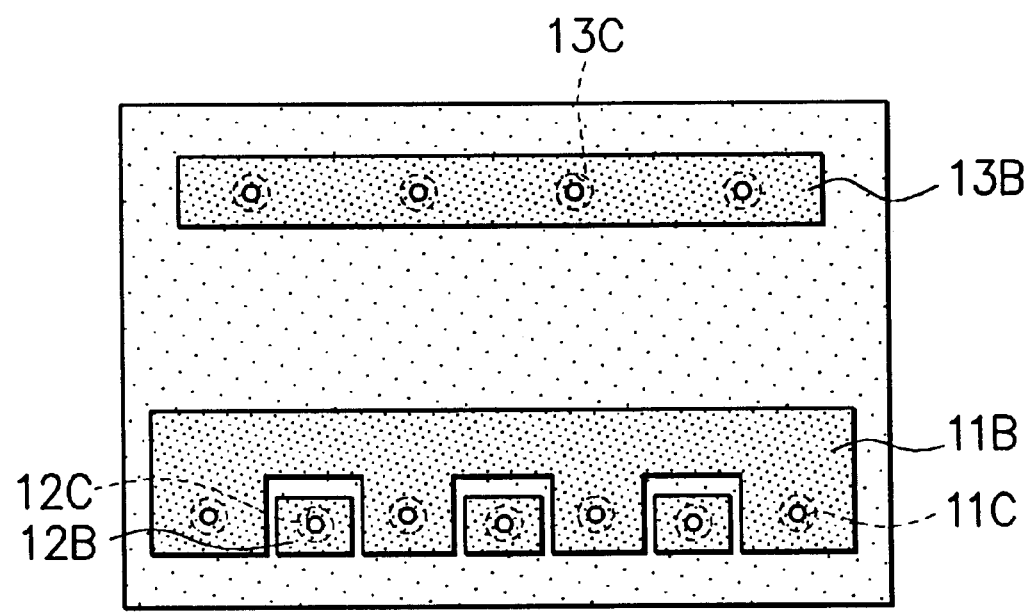

A chip of a first embodiment is shown in FIG. 1A and FIG. 1B. FIG. 1A is a plane view showing a front face of the chip and FIG. 1B is a bottom view of a reverse face of the chip.

On an operating layer (an active region) of a semiconductor substrate, a source electrode 11, a gate electrode 12 and a drain electrode 13 composing a FET are formed in a shape of teeth of a comb.

A source via hole receiving pad 11A led out from the source electrode 11 is provided on the front face of the semiconductor substrate, while a source bonding pad 11B is provided on the reverse face. These source via hole receiving pad 11A and source bonding pad 11B are connected to each other through a via hole 11C. In other words, electric potential of the source electrode 11 is led out to the source bonding pad 11B on the reverse face.

Similarly 12A is a gate via hole receiving pad on the front face of the semiconductor substrate led out from the gate electrode 12, 12B is a gate bonding pad on the reverse face, and 12C is a via hole. As well, 13A is a drain via hole receiving pad on the front face of the semiconductor substrate led out from the drain electrode 13, 13B is a drain bonding pad on the reverse face, and 13C is a via hole.

In this embodiment all regions except a peripheral isolation region on the front face of the semiconductor substrate are covered with a resin insulating film 14 such as polyimide. That is, all the aforementioned electrodes 11 to 13 and the via hole receiving pads 11A to 13A are covered with the insulating film 14.

The upper surface of the aforementioned insulating film 14 is covered with a metal film 15. As a method of covering the insulating film 14 with the metal film 15, either one of sputtering, deposition, plating or combinations thereof may be used. It is noted that although the electrodes 11 to 13 and the via hole receiving pads 11A to 13A actually cannot be seen from the outside as they are covered with the insulating film 14 and the metal film 15, they are shown in FIG. 1A for the purpose of illustration.

At the peripheral isolation region on the front face of the semiconductor substrate, a fringe metal layer 16 which strengthens adhesion to the semiconductor substrate is formed. A side surface of the aforementioned insulating film 14 is then covered with this fringe metal layer 16.

As described above, the metal film 15 performs as an upper surface protective film of the insulating film 14, while the fringe metal layer 16 performs as a side surface protective film of the insulating film 14. Therefore, the chip is so structured that all of the upper surface and the side surfaces of the insulating film 14 are covered with the metal protective films. Thereby, a significantly superior moisture resistance will be realized because exposed parts of both faces on the device are composed only of the semiconductor substrate or the metal which adheres strongly to this semiconductor substrate.

Incidentally, when mounting the chip in the case of this embodiment, both faces will be turned upside down as compared with the usual case and it bonds to the respective bonding pads 11B to 13B of the source, the gate, and the drain on the reverse face of the chip.

By adopting the structure that all of the upper surface and the side surfaces of the insulating film 14 are covered with the metal as described above, applied implementation as follows can be realized.

(1) By connecting one of a plurality of electrodes such as the source, the gate, and the drain to the metal protective film, the metal protective film can be utilized as an electrode.

(2) In a case that a certain electrode is connected to the metal protective film, if there are a plurality of these electrodes, for example if there are a plurality of the electrodes such as the source electrodes 11 shown in FIG. 1A, those plurality of electrodes on the same electric potential (a plurality of the source electrodes 11) may be connected to the metal protective film.

(3) The metal protective film only needs to cover the upper surface and the side surfaces of the insulating film. Therefore, when there are some areas which are not covered with the insulating film above the front face of the chip, those uncovered regions need not be covered with the metal protective film.

(4) The electrode which is led out to the reverse face of the chip may be led out again to the front face of the chip within the "uncovered regions with the insulating film" described in (3).

(5) The connection between the front face and the reverse face of the chip may be performed by using the side surface of the chip in addition to using the via hole.

These applied examples have the following effects. For example, in the applied examples (1) and (2), when the electrode which is connected to the metal protective film is ground electric potential such as ground etc., an electromagnetic shield effect by the metal protective film can be obtained. Since a plurality of the electrodes are connected to the metal protective film especially in the applied example (2), heat release occurs through the metal protective film having a large superficies. Therefore, the heat release property can be improved. Additionally, in the applied example (4) a contact above the front face of the chip will be possible.

Second Embodiment

Figure 2A:
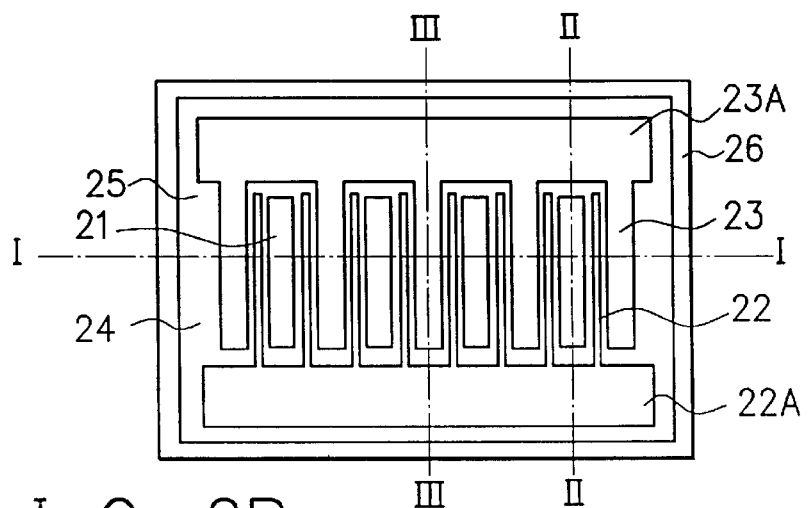
FIG. 2A to FIG. 2E are schematic views showing a chip of a second embodiment.
Figure 2B:
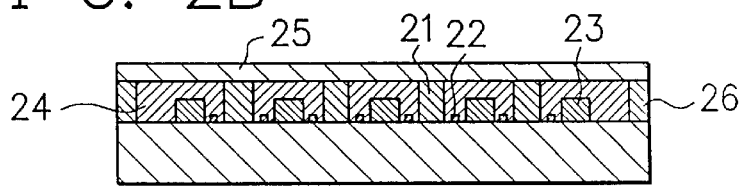
Figure 2C:
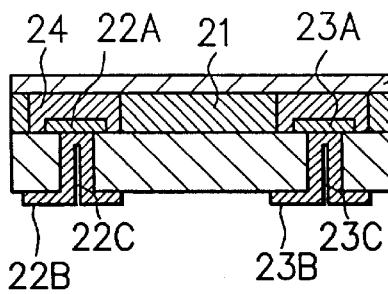
Figure 2D:
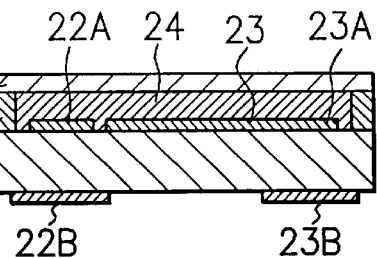
Figure 2E:
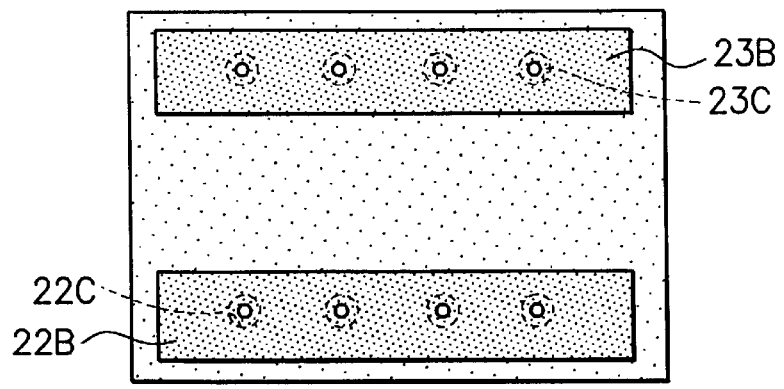

A second embodiment corresponds to the aforementioned applied examples (1) and (2). Specifically the source electrode is connected to the metal protective film. A chip of the second embodiment is shown in FIG. 2A to FIG. 2E. FIG. 2A is a plane view showing a front face of the chip. FIG. 2B is a sectional view taken along the I—I line in FIG. 2A. FIG. 2C is a sectional view taken along the II—II line in FIG. 2A. FIG. 2D is a sectional view taken along the III—III line in FIG. 2A. FIG. 2E is a bottom view of a reverse face of the chip.

On an operating layer of a semiconductor substrate, a source electrode 21, a gate electrode 22, and a drain electrode 23 composing a FET are formed in a shape of teeth of a comb.

A gate via hole receiving pad 22A led out from the gate electrode 22 is provided on the front face of the semiconductor substrate, while a gate bonding pad 22B is provided on the reverse face. These gate via hole receiving pad 22A and gate bonding pad 22B are connected to each other through a via hole 22C.

Similarly a drain via hole receiving pad 23A led out from the drain electrode 23 is provided on the front face of the semiconductor substrate, while a drain bonding pad 23B is provided on the reverse face. These drain via hole receiving pad 23A and drain bonding pad 23B are connected to each other through a via hole 23C.

At a peripheral isolation region on the front face of the semiconductor substrate, a fringe metal layer 26 which strengthens adhesion to the semiconductor substrate by alloying is formed. This isolation region is isolated as a semiconductor and is electrically independent completely.

Here, as shown in FIG. 2B and FIG. 2C, the source electrode 21 is formed to be higher by wiring of the second layer than the gate electrode 22, the gate via hole receiving pad 22A and the drain electrode 23, the drain via hole receiving pad 23A, and is formed to approximately the same height as the fringe metal layer 26.

Within the inner side of the fringe metal layer 26, polyimide etc. as an insulating film 24 is applied and the gate electrode 22, the drain electrode 23, the gate via hole receiving pad 22A and the drain via hole receiving pad 23A are covered with the insulating film 24. Therefore, different electrodes are insulated from one another. However, only the source electrode 21 is exposed to the upper surface of the insulating film 24.

Then, all of the upper surface of the insulating film 24, the upper surface of the fringe metal layer 26 and the upper surface of the source electrode 21 exposed to the upper surface of the insulating film 24 are covered with the metal film 25. Therefore, the source electrode 21 and the fringe metal layer 26 are connected through this metal film 25. However, the metal film 25 is insulated from the gate electrode 22 (the gate via hole receiving pad 22A) and the drain electrode 23 (the drain via hole receiving pad 23A) by the insulating film 24.

It is noted that though the electrodes 21 to 23 and the via hole receiving pads 22A and 23A actually cannot been seen from the outside as they are covered with the metal film 25, they are shown in FIG. 2A for the purpose of illustration.

As described above, the metal film 25 performs as an upper surface protective film of the insulating film 24 and the fringe metal layer 26 performs as a side surface protective film of the insulating film 24. Therefore, the chip is so structured that all of the upper surface and the side surfaces of the insulating film 24 are covered with the metal protective films and a significantly superior moisture resistance can be realized. Moreover, since there is no need to lead out the source electrode 21 to the reverse face of the semiconductor substrate, the source via hole receiving pad and the source bonding pad described in the first embodiment will not be needed. Therefore, similarly to the chip having the source via hole structure described in the conventional example, it becomes possible to mount the chip by utilizing the reverse face to the bonding face of the gate and the drain (that is, the face with the metal protective film) as ground of the source. In addition, since the metal film 25 above the front face of the chip can be flattened, it becomes possible to mount the chip easily on the device where the main way of mounting is flip chip mounting.

Referring to FIG. 2A to FIG. 6, a method of manufacturing the semiconductor device according to this embodiment will be explained hereinafter. Here, it will be explained by taking MESFET for instance, which is a compound semiconductor device using a GaAs substrate etc. and has a high-frequency characteristic. Note that the same components as described in FIG. 2A to FIG. 2E will be explained with the same reference numerals and symbols in FIG. 3 to FIG. 6.

First of all, isolation is performed to the semiconductor substrate 27 by a method such as ion implantation, mesa etch, or the like so as to form an operating layer 30.

Figure 3:
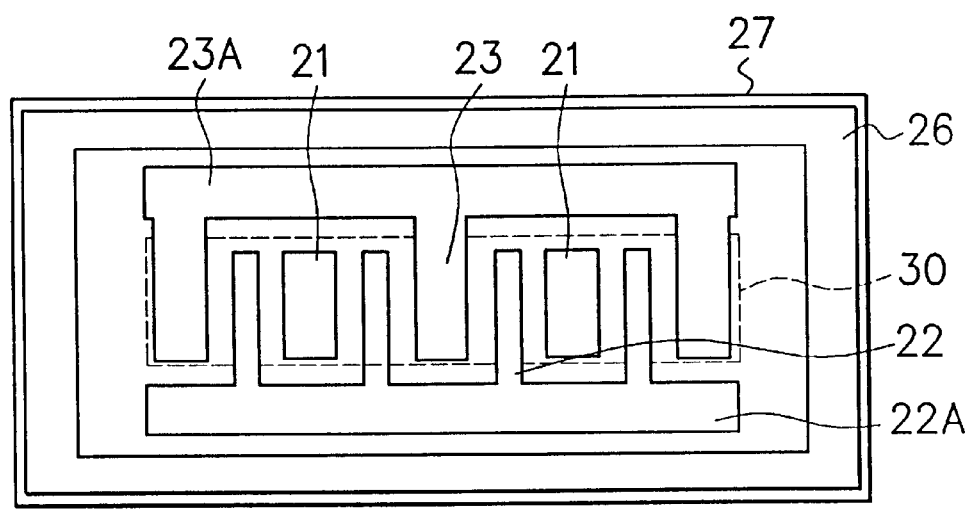
FIG. 3 is a plane view illustrating a process of manufacturing the chip of the second embodiment.

Subsequently as shown in FIG. 3, a gate electrode 22 subjected to Schottky junction using metal such as WSi etc., and a source electrode 21 and a drain electrode 23 with an ohmic property using metal such as AuGe etc., are formed in a shape of teeth of a comb on the operating layer 30. An Au-plating layer with a film thickness of about 3 µm is formed for the ohmic metal to secure electric current density of the electrode.

Furthermore, a gate via hole receiving pad 22A and a drain via hole receiving pad 23A are provided on the front face of the semiconductor substrate 27. Then, a fringe metal layer 26 is formed on the isolation region outside the operating layer 30.

Figure 4:
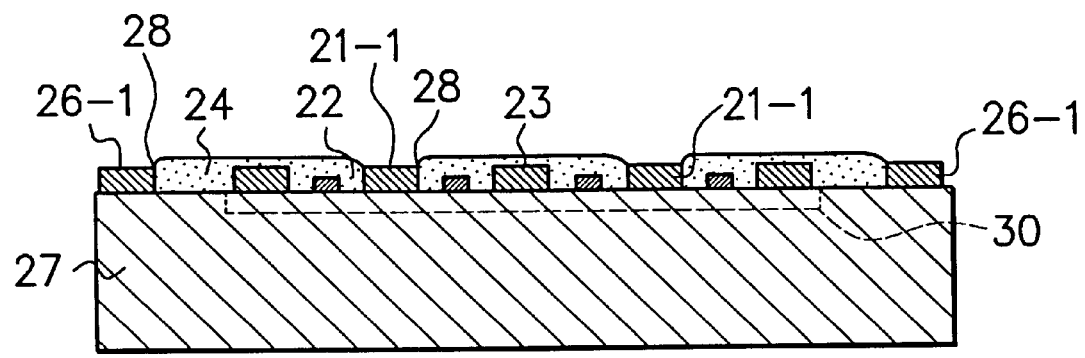
FIG. 4 is a sectional view illustrating a process of manufacturing the chip of the second embodiment.

Thereafter, polyimide as the insulating film 24 is applied to whole surfaces as shown in FIG. 4. Then, opening portions 28 are formed at the source electrode 21-1 and the fringe metal layer 26-1 of the insulating film 24 to expose the upper surfaces of these source electrode 21-1 and fringe metal layer 26-1. As a process of making the openings, etching etc. with chemicals using a photosensitive polyimide as the insulating film 24 may be performed.

Figure 5:
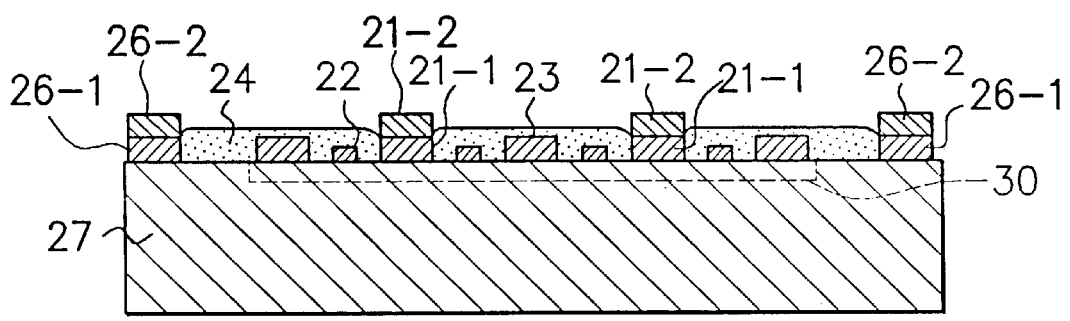
FIG. 5 is a sectional view illustrating a process of manufacturing the chip of the second embodiment.

A source wiring 21-2 of the second layer and a fringe metal layer 26-2 of the second layer are then formed at the opening portions 28 by electrolytic Au plating as shown in FIG. 5. In other words, after forming the opening portions 28, metal is deposited on the whole surfaces by a method such as sputtering, and then patterning is performed to make smaller areas than the opening portions 28 for plating. Subsequently the Au-plating layer with a film thickness of about 4 µm is formed. By using this Au-plating layer as a mask, the metal which is deposited by a method such as sputtering should be removed by etching such as milling method.

Figure 6A:
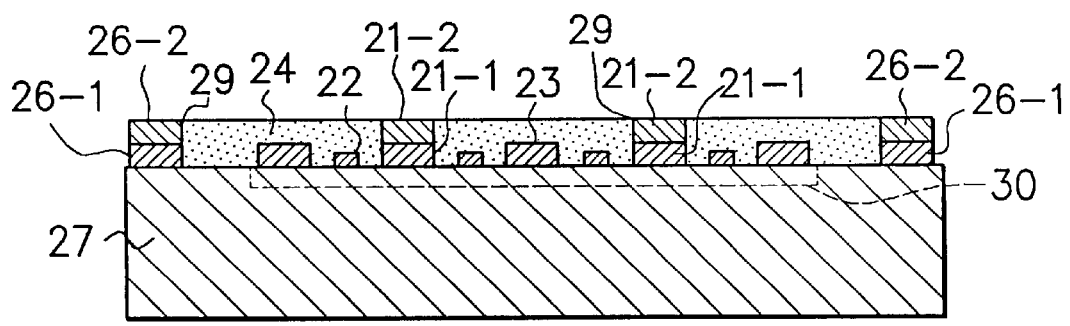
FIG. 6A and FIG. 6B are schematic views illustrating a process of manufacturing the chip of the second embodiment.
Figure 6B:
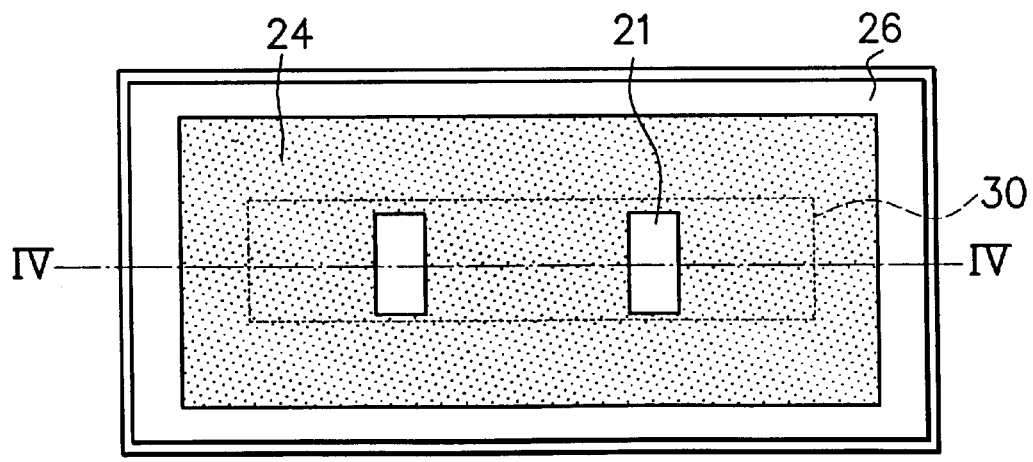

Next polyimide as the insulating film 24 is applied to the whole surfaces as shown in FIG. 6A and FIG. 6B. FIG. 6A is a sectional view taken along the IV—IV line in FIG. 6B. Then, opening portions 29 are formed at the source electrode 21-2 (the source wiring of the second layer) and the fringe metal layer 26-2 to expose the upper surfaces of these source electrode 21-2 and fringe metal layer 26-2. At this time as shown in FIG. 6B, only the upper surface of the source electrode 21-2 (the source wiring of the second layer) is exposed to the front face of the chip inside the fringe metal layer 26-2, while other electrodes 22, 23 and pads 22A, 23A are covered with the insulating film 24.

Thereafter, metal such as Ti or Ni etc. are deposited on the whole surfaces by a method such as sputtering. Then, patterning is performed with resist so as to make a rectangular opening slightly inside of the chip region (inside of the outer edge of the fringe metal layer 26) above the transistor region which includes the fringe metal layer 26 and the gate electrode 21. Subsequently, an Au-plating layer with a film thickness of about 3 µm is formed and the resist is removed. As described above the metal film 25 is formed as shown in FIG. 2B to complete the forming step of the front face of the substrate. The metal film 25 composing the metal protective film has a foundation layer of the sputtered metal and the Au-plating layer, so that adhesiveness to the insulating film 24 can be increased.

Next, proceeding to the forming step of the reverse face of the substrate, the via holes 22C and 23C are formed from the reverse face of the semiconductor substrate 27 by dry etching etc. as shown in FIG. 2C and FIG. 2E. Then, respective bonding pads 22B and 23B are plated with Au to complete the chip according to this embodiment.

Third Embodiment

Figure 7A:
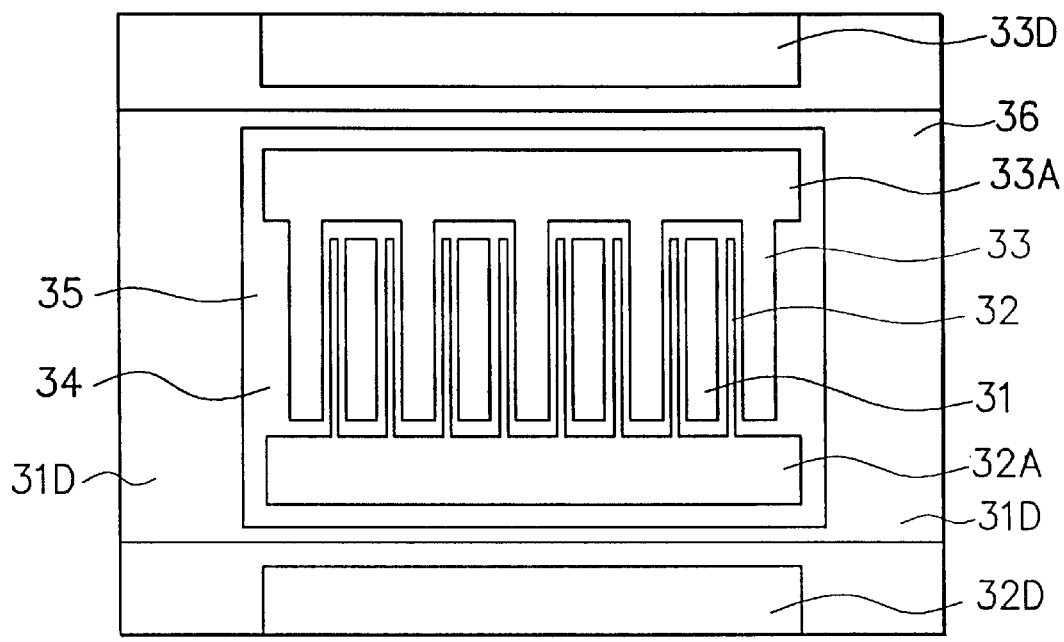
FIG. 7A and FIG. 7B are schematic views showing a chip of a third embodiment.
Figure 7B:
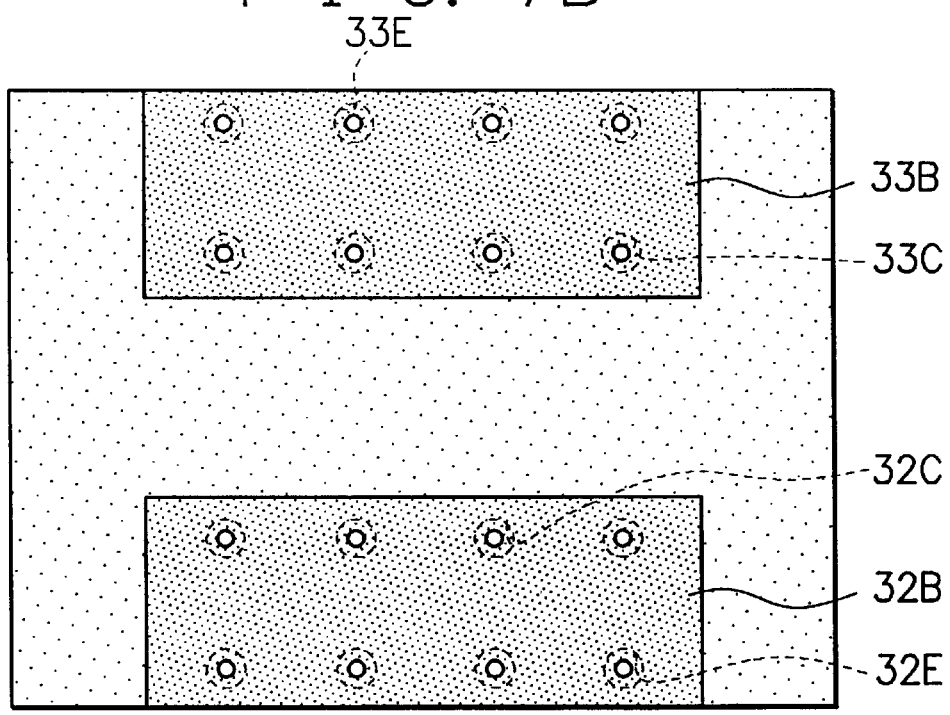

A third embodiment corresponds to the aforementioned applied example (4). In FIG. 7A and FIG. 7B, a chip of the third embodiment is shown. FIG. 7A is a plane view showing a front face of the chip and FIG. 7B is a bottom view showing a reverse face of the chip. It is noted that the difference from the second embodiment described above will be focused on hereinafter.

Similarly to the second embodiment described above, a source electrode 31, a gate electrode 32, and a drain electrode 33 composing a FET are formed in a shape of teeth of a comb on an operating layer of a semiconductor substrate.

A gate via hole receiving pad 32A led out from the gate electrode 32 is provided on the front face of the semiconductor substrate, while a pad 32B (which is referred to as "a gate relay pad" hereinafter) is provided on the reverse face. These gate via hole receiving pad 32A and gate relay pad 32B are connected to each other through a via hole 32C.

Similarly, a drain via hole receiving pad 33A led out from the drain electrode 33 is provided on the front face of the semiconductor substrate, while a pad 33B (which is referred to as "a drain relay pad" hereinafter) is provided on the reverse face. These drain via hole receiving pad 33A and drain relay pad 33B are connected to each other through a via hole 33C.

Similarly to the second embodiment described above, within the inner side of a fringe metal layer 36, polyimide etc. as an insulating film 34 is applied, and the gate electrode 32, the drain electrode 33, the gate via hole receiving pad 32A and the drain via hole receiving pad 33A are covered with the insulating film 34. Then, all of the upper surface of the insulating film 34, the upper surface of the fringe metal layer 36 and the upper surface of the source electrode 31 exposed to the upper surface of the insulating film 34 are covered with the metal film 35. Therefore, the source electrode 31 and the fringe metal layer 36 are connected to each other through this metal film 35.

Here, as shown in FIG. 7A, a peripheral isolation region on the front face of the semiconductor substrate is secured largely and space exists outside of the fringe metal layer 36 in this embodiment. In this space of the isolation region a gate bonding pad 32D is provided on the side of the gate via hole receiving pad 32A. This gate bonding pad 32D is connected to the gate relay pad 32B on the reverse face of the semiconductor substrate through another via hole 32E than the aforementioned via hole 32C. In other words, the gate electrode 32 is connected to the gate relay pad 32B on the reverse face through the via hole 32C further through the gate via hole receiving pad 32A on the front face of the chip. Furthermore, it is connected to the gate bonding pad 32D on the front face through the via hole 32E.

Similarly, in the space of the isolation region a drain bonding pad 33D is provided on the side of the drain via hole receiving pad 33A. This drain bonding pad 33D is connected to the drain relay pad 33B on the reverse face of the semiconductor substrate through another via hole 33E than the aforementioned via hole 33C. In other words, the drain electrode 33 is connected to the drain relay pad 33B on the reverse face through the via hole 33C further through the drain via hole receiving pad 33A on the front face of the chip. Furthermore, it is connected to the drain bonding pad 33D on the front face through the via hole 33E.

Additionally, both sides of the fringe metal layer 36 are made larger in this embodiment as shown in FIG. 7 to be used as source electrode pads 31D.

As described above, the metal film 35 performs as an upper surface protective film of the insulating film 34 and the fringe metal layer 36 performs as a side surface protective film of the insulating film 34. Therefore, the chip is so structured that all of the upper surface and the side surfaces of the insulating film 34 are covered with the metal protective films. Thereby, a significantly superior moisture resistance will be realized. Moreover, bonding can be performed on both sides of the chip, so that mounting design with extremely high flexibility can be available.

In the aforementioned first to third embodiments the insulating films 14, 24, and 34 are covered with the metal films 15, 25, and 35 as the upper surface protective films, as well as they are covered with the fringe metal layer 16, 26, and 36 as the side surface protective films. Thereby strengthened metal protective films are formed. However depending on required reliability, after forming an insulating film, metal may be formed on the whole surfaces of the insulating film at a time by sputtering, deposition, or the like without dividing the metal protective films into the upper part and the side part. Of course it can be considered that strength may be increased by Au-plating or the like on the once formed metal protective film. In this case, when the metal protective film which covers the resin insulating film terminates directly at a semiconductor substrate, an insulating film such as an $SiO_2$ film and an SiN film, or the like, reliability can be improved together with higher adhesiveness by using a foundation such as Ti, Ni, or the like, which has a superior adhesiveness.

Incidentally, while the front face and the reverse face of the chip are connected through the via hole in the aforementioned first to third embodiments, it can be considered that this connection is realized by using a side face of the chip. For example, an electrical connecting member may be provided at the side face of the semiconductor chip so as to connect the front face and the reverse face of the aforementioned semiconductor substrate through this electrical connecting member.

According to the present invention, in addition that the front face of the semiconductor chip is covered with the resin insulating film, this resin insulating film is further covered with the metal film. Thus, moisture resistance can be significantly improved to obtain a highly reliable semiconductor device without cost increase.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
    a plurality of electrodes connected to an active region of a front face of a semiconductor chip;
    a resin insulating film provided on the active region;
    a metal protective film covering all of an upper surface and side surfaces of said resin insulating film; and
    one or a plurality of electrical connecting portions of a reverse face leading out at least one electric potential of said plurality of electrodes, provided at the reverse face of the semiconductor chip.

2. The semiconductor device according to claim 1, wherein all the electric potential of said plurality of electrodes are led out to the reverse face by said electrical connecting portion of the reverse face.

3. The semiconductor device according to claim 1, wherein one of said plurality of electrodes is connected to said metal protective film.

4. The semiconductor device according to claim 1, wherein a plurality of electrodes on the same electric potential of said plurality of electrodes are connected to said metal protective film.

5. The semiconductor device according to claim 1,
wherein said resin insulating film is provided above all of the front face of the semiconductor chip and said metal protective film covers the upper surface and the side surfaces of said resin insulating film.

6. The semiconductor device according to claim 1,
wherein said resin insulating film is provided above some part of the front face of the semiconductor substrate and said metal protective film covers the upper surface and the side surfaces of said resin insulating film.

7. The semiconductor device according to claim 6, further comprising:
an electrical connecting portion of the front face isolated electrically from said metal protective film on a region of the semiconductor chip where said resin insulating film is not provided,
wherein said electrical connecting portion of the front face is connected to said electrical connecting portion of the reverse face.

8. The semiconductor device according to claim 1,
wherein connection between the front face and the reveres face of the semiconductor chip is performed via a connecting hole going through the semiconductor chip.

9. The semiconductor device according to claim 1,
wherein connection between the front face and the reveres face of the semiconductor chip is performed through an electrical connecting portion of a side surface provided at the side surface of the semiconductor chip.

10. The semiconductor device according to claim 1,
wherein the semiconductor chip is a compound semiconductor.

11. The semiconductor device according to claim 10,
wherein said plurality of electrodes comprise a gate electrode, a source electrode, and a drain electrode, and the active region composes a FET.

12. The semiconductor device according to claim 11,
wherein the source electrode is connected to said metal protective film, and the gate electrode and the drain electrode are connected to said respective electrical connecting portions of the reverse face.

13. The semiconductor device according to claim 11,
wherein the gate electrodes, the source electrodes, and the drain electrodes are plurally arranged in a shape of teeth of a comb, the source electrodes being connected to said metal protective film and the gate electrodes and the drain electrodes being connected to said respective electrical connecting portions of the reverse face.

14. The semiconductor device according to claim 1,
wherein a foundation layer is formed between said metal protective film and said resin insulating film.

* * * * *